United States Patent [19]
Stalley et al.

[11] 3,973,817
[45] Aug. 10, 1976

[54] INTERCONNECTION OF CIRCUIT BOARDS

[75] Inventors: Anthony Donald Stalley, Camberley; Michael Anthony Richard Young, Newbury, both of England

[73] Assignee: Quantel Limited, England

[22] Filed: June 3, 1975

[21] Appl. No.: 583,384

[30] Foreign Application Priority Data
June 6, 1974  United Kingdom............... 25075/74

[52] U.S. Cl............................. 339/14 R; 174/68.5; 317/101 DH; 339/17 LC
[51] Int. Cl.².......................................... H01R 3/06
[58] Field of Search............... 339/14, 17, 111, 143, 339/176, 184–186; 174/68.5; 317/101 DH

[56] References Cited
UNITED STATES PATENTS

| | | | |
|---|---|---|---|
| 2,881,404 | 4/1959 | Kamm............................ | 339/17 LM |
| 3,432,795 | 3/1969 | Jayne ................................ | 339/17 L |
| 3,614,714 | 10/1971 | Silverstein...................... | 339/186 M |
| 3,641,475 | 2/1972 | Irish et al. .......................... | 339/17 L |
| 3,673,669 | 7/1972 | Edstrom et al................ | 339/176 MP |

*Primary Examiner*—Joseph H. McGlynn
*Attorney, Agent, or Firm*—Dowell & Dowell

[57] ABSTRACT

A circuit board having a multiway connector disposed along one edge thereof. The multiway connector includes a plurality of contacts. Earth path contacts of the connector are offset in relation to the remaining contacts so as to be the first to make connection with the corresponding connector upon insertion of the board into the connector and conversely the last to break connection upon extraction of the board from the corresponding connector.

3 Claims, 11 Drawing Figures

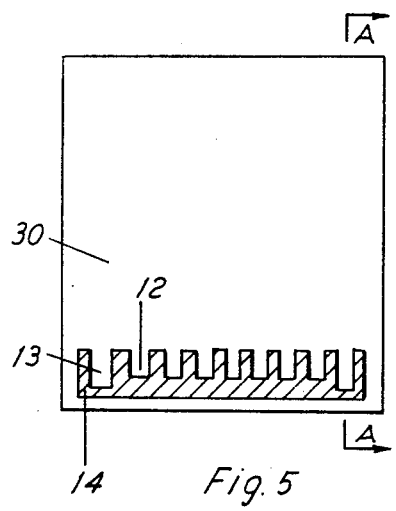
Fig. 5
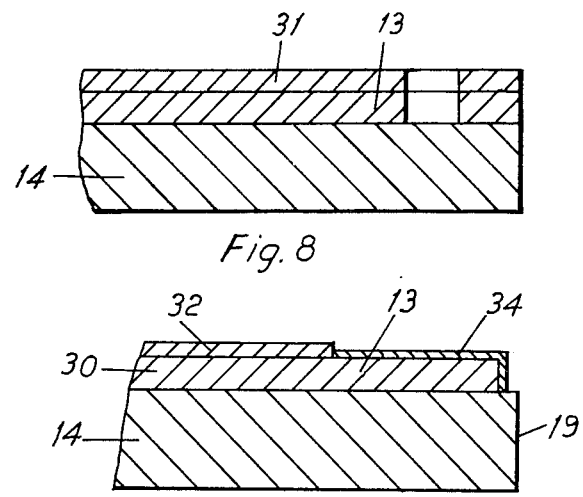
Fig. 8
Fig. 9
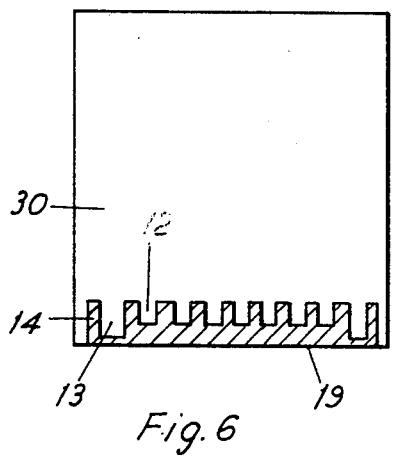
Fig. 6
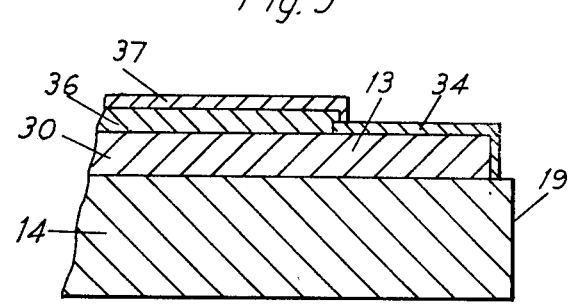
Fig. 10
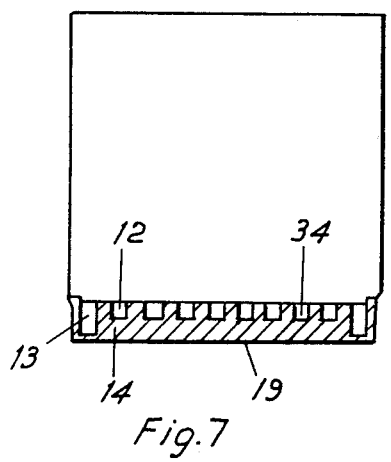
Fig. 7
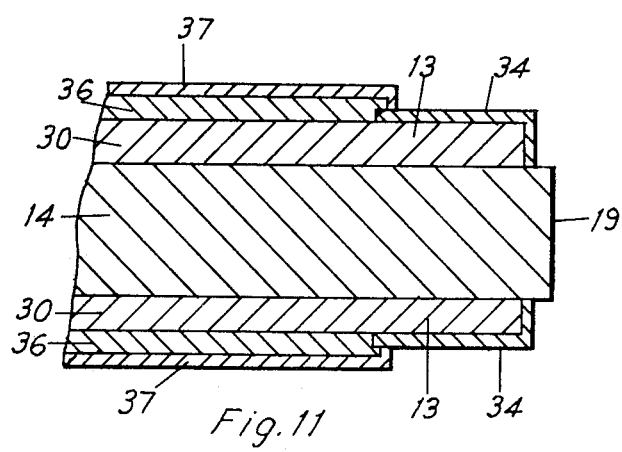
Fig. 11

INTERCONNECTION OF CIRCUIT BOARDS

BACKGROUND TO THE INVENTION

This invention concerns the interconnection of related electronic circuit boards in a system by means of multiway edge connectors.

It is common practice to use one or more such multiway connectors at one edge of an electronic circuit board, so that a multiplicity of signal, power and earth paths are connected simultaneously when the board is inserted into the system. Problems arise as a result of misalignment of the board and the mating halves of the connectors, and also irregularities in the contact positions within the connectors, either of which give rise to inconsistencies in the sequence in which the signal, power and earth contacts are connected together. Where electronic circuit boards using more than one power supply voltage are interconnected in a system, it is well known that semiconductor devices can be damaged or destroyed by insertion or extraction of one or more of the boards, with the power supplies switched on. To protect vulnerable semiconductor devices against damage caused by accidental removal of boards without previously disconnecting the power, protection devices can be fitted to all susceptible input and output ports. In digital systems where a multiplicity of signal input and output paths are used, a very large number of protection circuits would have to be incorporated. The need for some form of protection is imperative where low voltage, low impedance bi-polar integrated circuits are interconnected with higher voltage, high impedance field-effect integrated circuits which are very easily ruptured.

OBJECT OF THE INVENTION

An object of the present invention is to provide satisfactory protection for both analogue and digital circuitry using perhaps a mixture of devices employing different semiconductor technologies, without the need for additional protection components.

SUMMARY OF THE INVENTION

According to the present invention there is provided a circuit board having a multiway connector disposed along one edge thereof for insertion into a corresponding connector, said multiway connector including a plurality of contacts, earth path contacts forming part of said plurality of contacts and offset in relation to the remaining contacts so as to be the first to make connection with the corresponding connector upon insertion of the board into said corresponding connector and conversely the last to break connection upon extraction of the board from said corresponding connector.

The problem of connection sequence arises particularly in a printed circuit board comprising etched copper tracks on an insulating laminate which is supported in the system assembly by guide rails made of an insulating plastics material. Where two part multiway connectors are used, the problem can be satisfactorily overcome by extending the contact or contacts used for the earth circuit from either or both of the mating halves of the connector. However, it is now common practice to employ "one-part" connectors in which the board half of the connector pair is formed by extending the etched copper tracks to the edge of the laminate. A corrosion resistant finish such as gold plating is used on the copper tracks to improve contact performance. Also the invention relates to methods of manufacturing the printed circuit boards having gold plated etched copper contacts with one or more contacts protruding beyond the others to provide prior earthing.

BRIEF DESCRIPTION OF THE DRAWINGS

The invention will now be described by way of example with reference to the accompanying drawings, in which:

FIGS. 8 to 11 are sectional views of the board of FIG. 5 taken along the line A—A showing steps in this process.

DESCRIPTION OF PREFERRED EMBODIMENTS

Figure 1:
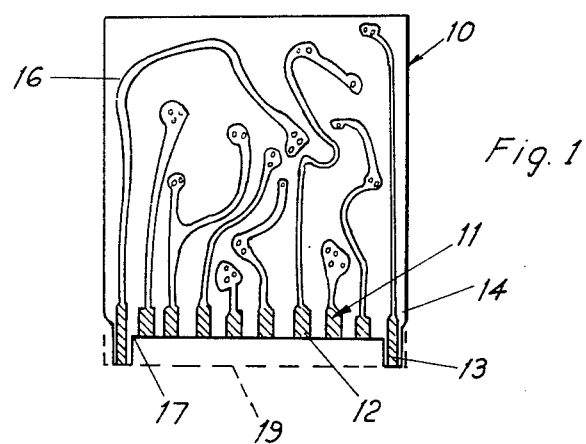
FIG. 1 shows the plan view of a circuit board having an edge connector according to the invention.

The printed circuit board 10 of FIG. 1 comprises an insulated laminate board 14 (e.g. glass-fibre) having an etched connector 11 formed by a plurality of fingers 12 connected to printed circuit paths 16 which have been formed from a copper layer by known techniques. Prior earthing is achieved by suitably profiling the edge of the laminate 14 after the desired contact fingers has been etched and goldplated. A protruding earth contact finger 13 at or near each edge of the module ensures prior connection of the earth circuit despite possible mechanical misalignment. The boards may be produced using standard through hole plating techniques. When profiling the cards, the connector edge of the board is routed using an ⅛ inch pin and ⅛ inch cutter to remove the majority of the base material so that the leading edge 19 is partially removed to provide a profiled portion with protruding fingers 13. This will leave a 1/16 inch radius in the corners which would be unsuitable when inserting the boards. This problem is however overcome by skim routing using a 1/32 inch pin and cutter leaving only a 1/64 inch radius in corners 17.

Figure 2:
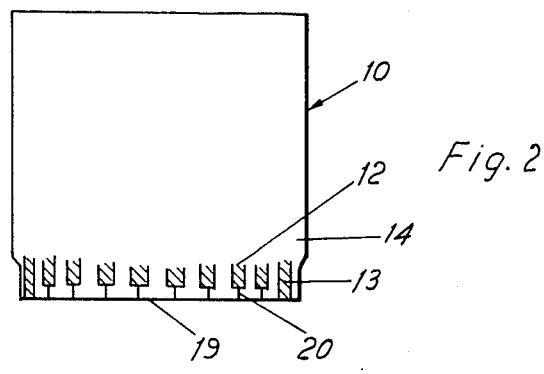
FIGS. 2 and 3 show steps in forming a further embodiment of the invention.
Figures 3, 4:
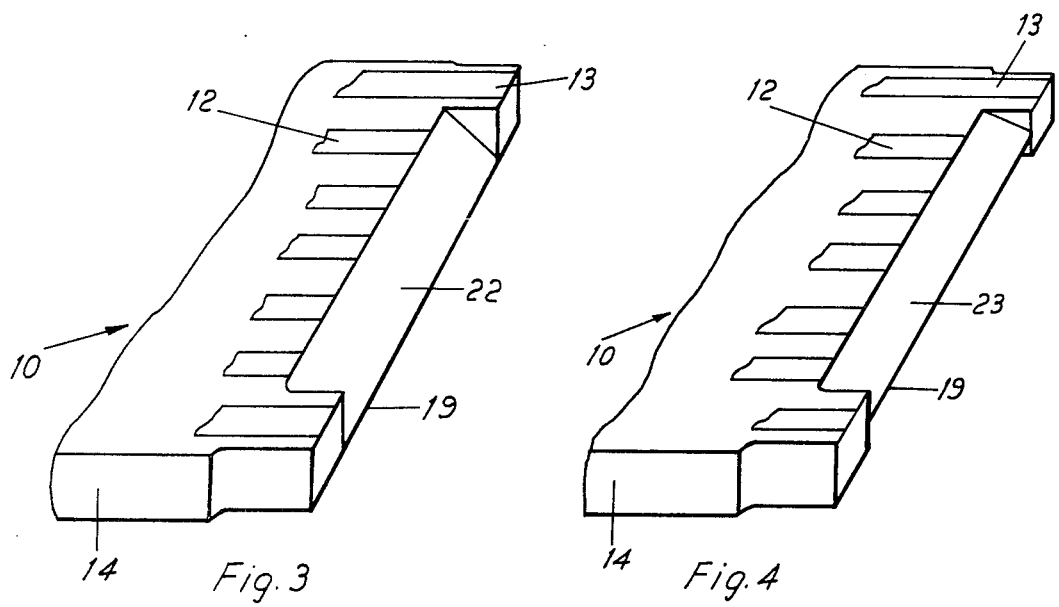
FIG. 4 shows a modified form of the embodiment of FIG. 3, FIGS. 5, 6, and 7 show steps in forming a third embodiment according to the invention.

Alternative solutions where prior earthing is achieved by bevelling the edge of the laminate is shown in FIGS. 3 and 4. The boards are produced using standard through hole plating techniques. The boards are then profiled (see FIG. 2) leaving the leading edge 19 straight, then the fingers 12 are chamfered as in FIG. 3 to remove the plating tags 20, thus leaving sloping edge 22 on the final board so as to provide priority earth fingers 13.

If double sided connectors are provided with fingers on both sides of the board then each face can be chamfered into a substantially V-shaped edge 23 as shown in FIG. 4.

A superior solution is to provide staggered gold plated contacts by chemical etching, without the need for further machining.

In this process the copper layer 30 on the laminate 14 of board 10 is masked in a pattern corresponding to the desired finger arrangement required. This mask 31 (see FIG. 8) may be of an etching resistant ink. The remaining area of the copper layer 30 which will eventually receive the printed circuit is also masked.

The board then receives a chemical etchant which etches the exposed copper areas till the laminate 14 is uncovered so that the desired contact finger pattern is formed (see FIG. 5).

The board is then cropped as in FIG. 6 so that the fingers 13 are close to the leading edge 19 of the board. The board is then covered with a new mask 32 so that only the fingers 12 and 13 are exposed and these receive a plating of gold 34 over the copper (see FIG. 9).

The mask 32 is then removed and the board drilled, metalised, printed and receives the copper plating 36 as in the normal through hole plating techniques. The gold-plated fingers 12 and 13 are masked during this process so that only 0.020 inch overlap of E.T.L. (electro-tinned lead) 37 is allowed onto the gold (see FIG. 10).

The edges of the boards are profiled leaving base material (laminate) between the connectors and board edge with all connector faces plated (see FIG. 7).

When boards are used which have copper on both faces and edge connectors are required on both these faces then the process as described above is again used but the process steps are carried out on both faces so that the connectors are formed with configuration as shown in FIG. 11.

The earth circuit described herein is meant to include a power supply common return circuit within its scope.

Edge connector sockets suitable for use with the edge connector arrangements according to the invention would be for example the Ferranti EZD 100 range.

We claim:

1. A circuit board having a multiway connector disposed along one end thereof for insertion into a corresponding connector, said multiway connector including:
   a. a plurality of elongate contacts disposed in parallel relationship with each other,
   b. earth path contacts forming part of said plurality of contacts and each having one end lying in a first plane,
   c. the remainder of the plurality of contacts not forming the earth path contacts each having one end lying in a second plane, said second plane being in substantially parallel relationship with said first plane but set back therefrom,
   whereby on insertion of said board into said corresponding connector said earth path contacts are the first to make connection with said corresponding connector, and on extraction of said board from said corresponding connector said earth path contacts are the last to break connection with said corresponding connector.

2. A circuit board according to claim 1 wherein the contacts of said multiway connector are provided on both sides of the circuit board.

3. A circuit board according to claim 1 wherein the earth path contacts are formed by the two outer contacts of the multiway connector.

* * * * *